United States Patent
Feiweier et al.

(10) Patent No.: US 7,603,157 B2
(45) Date of Patent: Oct. 13, 2009

(54) METHOD AND MAGNETIC RESONANCE IMAGING APPARATUS FOR COMPENSATING CONTRAST INHOMOGENEITIES IN MAGNETIC RESONANCE IMAGES

(75) Inventors: Thorsten Feiweier, Poxdorf (DE); Franz Hebrank, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 738 days.

(21) Appl. No.: 10/921,583

(22) Filed: Aug. 19, 2004

(65) Prior Publication Data

US 2005/0083054 A1  Apr. 21, 2005

(30) Foreign Application Priority Data

Aug. 19, 2003  (DE)  ............... 103 38 074

(51) Int. Cl.
*A61B 5/05*  (2006.01)
(52) U.S. Cl. .............. 600/410; 324/307; 324/309; 324/314
(58) Field of Classification Search ............. 600/412, 600/420, 407, 410; 324/314, 307, 309
See application file for complete search history.

(56) References Cited

U.S. PATENT DOCUMENTS

| | | | | |
|---|---|---|---|---|
| 5,485,085 A | * | 1/1996 | Sumanaweera et al. | 324/307 |
| 5,914,599 A | * | 6/1999 | Sharp | 324/318 |
| 5,998,996 A | | 12/1999 | Bernstein et al. | |
| 6,049,206 A | * | 4/2000 | Sharp | 324/314 |
| 6,150,815 A | * | 11/2000 | Janzen et al. | 324/309 |
| 6,185,444 B1 | * | 2/2001 | Ackerman et al. | 600/410 |
| 6,252,403 B1 | * | 6/2001 | Alsop | 324/318 |
| 6,320,378 B1 | * | 11/2001 | Maier et al. | 324/307 |
| 6,603,989 B1 | * | 8/2003 | Yablonskiy | 600/410 |
| 6,809,518 B2 | * | 10/2004 | Beaudoin et al. | 324/314 |
| 7,064,546 B2 | * | 6/2006 | Feiweier | 324/307 |
| 7,233,818 B1 | * | 6/2007 | Aletras et al. | 600/410 |

(Continued)

FOREIGN PATENT DOCUMENTS

| | | |
|---|---|---|
| WO | WO 99/30187 | 6/1999 |
| WO | WO 03/007010 | 1/2003 |

OTHER PUBLICATIONS

"Manipulation of Signal Intensity Distribution with Dielectric Loading at 7.0T," Yang et al, Proc. Intl. Soc. Magn. Reson. Med., vol. 9, (2001), p. 1096.

(Continued)

*Primary Examiner*—Brian Casler
*Assistant Examiner*—Joel M Lamprecht
(74) *Attorney, Agent, or Firm*—Schiff Hardin LLP

(57) ABSTRACT

In a method and magnetic resonance apparatus for compensation of contrast inhomogeneities in magnetic resonance images caused by spatial distributions of the radio frequency field associated with the radio frequency pulses that are emitted in order to acquire magnetic resonance (MR) data, multiple individual MR images of a particular region of a subject are recorded with different radio frequency pulse sequences leading to different flip angles. A common contrast-homogenized image for the affected region then is generated based on the different individual images, so that within the contrast-homogenized image, intensity variations due to a distribution of the flip angle are smaller than in the individual images, at least in some areas.

14 Claims, 5 Drawing Sheets

U.S. PATENT DOCUMENTS

| | | | |
|---|---|---|---|
| 7,235,972 B2 * | 6/2007 | Shah et al. | 324/309 |
| 2004/0071324 A1 * | 4/2004 | Norris et al. | 382/128 |
| 2004/0242994 A1 * | 12/2004 | Brady et al. | 600/420 |
| 2005/0116710 A1 * | 6/2005 | Ordidge et al. | 324/309 |
| 2005/0140369 A1 * | 6/2005 | Feiweier et al. | 324/318 |

OTHER PUBLICATIONS

"RF Inhomogeneity Compensation in Structural Brain Imaging," Diechmann et al, Magnetic Resonance in Medicine, vol. 47 (2002), pp. 398-402.

* cited by examiner

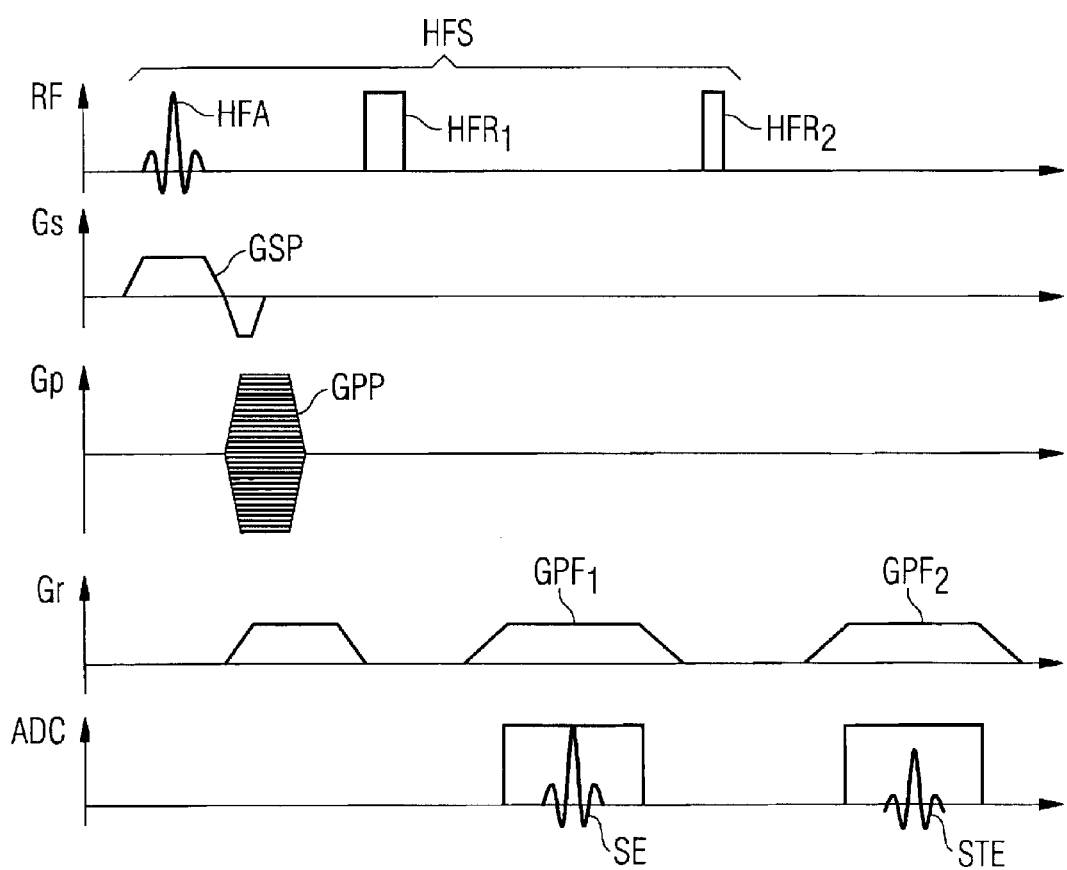

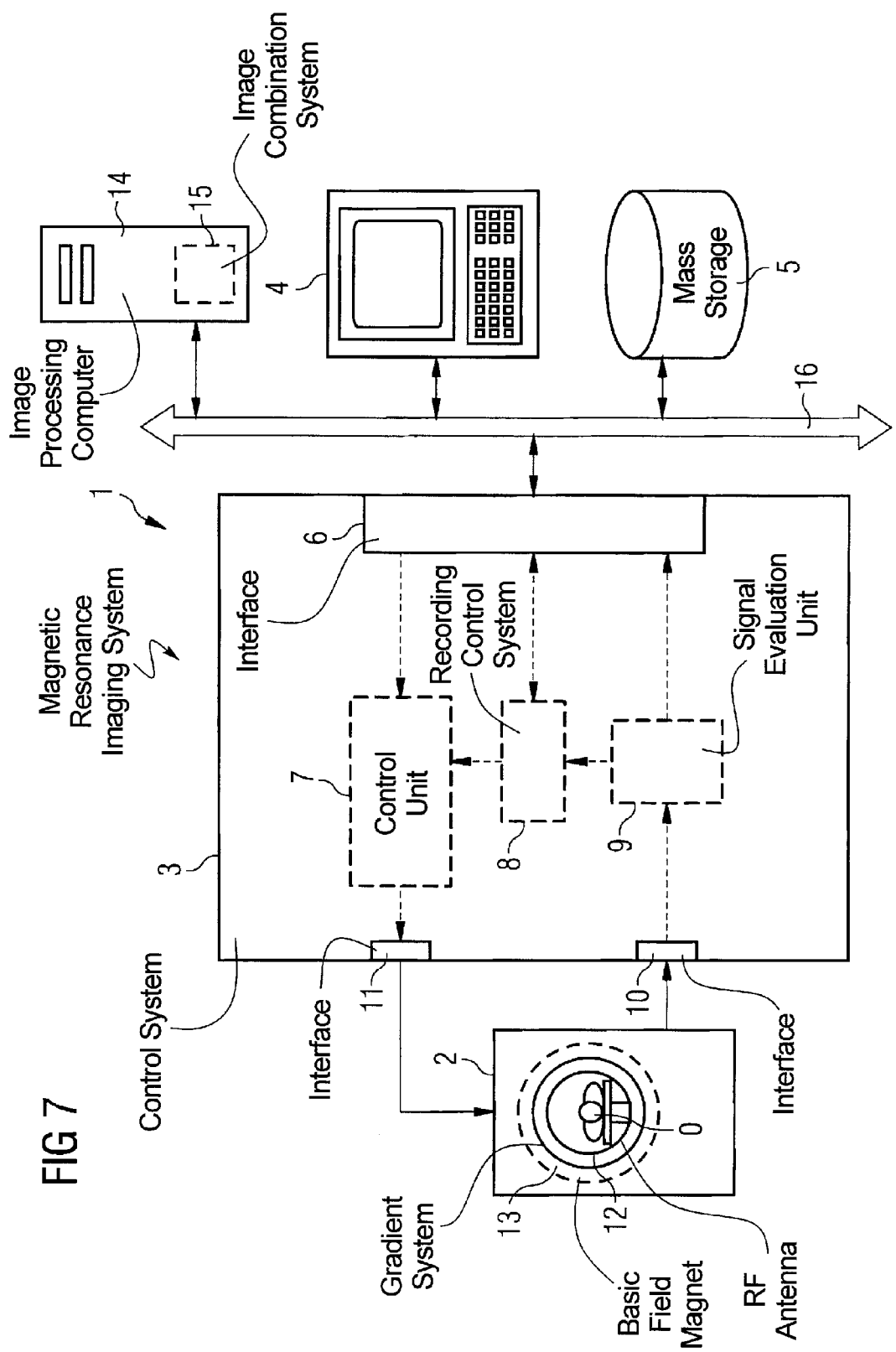

METHOD AND MAGNETIC RESONANCE IMAGING APPARATUS FOR COMPENSATING CONTRAST INHOMOGENEITIES IN MAGNETIC RESONANCE IMAGES

BACKGROUND OF THE INVENTION

1. Field of the Invention

The present invention concerns a process for the compensation of contrast inhomogeneities in magnetic resonance images caused by spatial distributions of the radio frequency field associated with the radio frequency pulses that are emitted in order to excite nuclear spins in the subject. The invention also concerns a magnetic resonance measurement system with a contrast homogenization feature in order to compensate for such contrast inhomogeneities in acquired magnetic resonance images.

2. Description of the Prior Art

Magnetic resonance imaging, also called magnetic resonance tomography, is a technique that is now widespread for acquiring images of the body interior of a living object to be examined. In order to acquire an image with this method, the body or the body part to be examined must first be exposed to a homogenous static basic magnetic field (usually characterized as a $B_0$ field), which is generated by a basic field magnet of the magnetic resonance measuring instrument (scanner). During the data acquisition for the magnetic resonance images, rapidly switched gradient fields for local coding are superimposed on this basic magnetic field, these fields being generated by gradient coils. Moreover, with radio frequency antennae, radio frequency pulses of a defined field strength are irradiated in the object to be examined. The magnetic flux density of these radio frequency pulses is usually termed as $B_1$. The pulse-shaped radio frequency field is therefore generally also called the $B_1$ field for short. By means of these radio frequency pulses the nuclear spins of the atoms in the object to be examined are excited in such a way that they are deflected by a so-called "excitation flip angle" (in the following also referred to as "flip angle") from their state of equilibrium parallel to the base magnetic field $B_0$. The nuclear spins then precess in the direction of the basic magnetic field $B_0$. The magnetic resonance signals generated as a result are picked up by radio frequency receiving antennae. The receiving antennae can either be the same antennae with which the radio frequency pulses are irradiated, or separate receiving antennae can be used. The magnetic resonance images of the object to be examined are finally created on the basis of the received magnetic resonance signals. Each pixel in the magnetic resonance image is assigned to a small body volume, a so-called "voxel", and every brightness or intensity value of the pixels is linked with the signal amplitude of the magnetic resonance signal received from this voxel. The relationship between a resonant irradiated radio frequency pulse with the field strength $B_1$ and the flip angle a achieved with it is given by the equation $$\alpha = \int_{t=0}^{\tau} \gamma \cdot B_1(t) \cdot dt \quad (1)$$

wherein γ is the gyromagnetic relationship, which for most magnetic resonance examinations is a fixed matter constant, and τ is the exposure time of the radio frequency pulse.

The flip angle achieved by an extended radio frequency pulse, and thus the strength or intensity of the magnetic resonance signal to be measured, thus depends not only on the length of the pulse, but also on the strength of the irradiated $B_1$ field. The contrast and brightness of a magnetic resonance image are likewise dependent on the flip angle of the irradiated radio frequency pulse. Insofar as a spatial distribution of the amplitude of the radio frequency field and thus the flip angle exists, the result is an undesired dependency of the image contrast on the spatial position, since the intensity distribution caused by the field distribution overlays the intensity distribution of the measured parameters (such as, for example, the tissue material in each position), which contains the image information. This sort of undesired amplitude distributions of the radio frequency field occur due to the penetration behavior of the radio frequency field in dielectric and conductive media, particularly in zones of high magnetic field strengths of over 3 Teslas, or due to the use of local transmission coils or transmission arrays.

A reduction in this effect could be achieved by taking steps to homogenize of the irradiated radio frequency field in the examination subject. Yang et al. in Proc. Intl. Suc. Mag. Reson. Med 9, 2001, page 1096, under the title "Manipulation of Signal Intensity Distribution with Dielectric Loading at 7.0 T" suggest using dielectric pillows to homogenize the radio frequency field in the body. However, until now there has been no universally functional configuration applicable for every body and every position. A practical implementation of this concept is thus not currently foreseeable.

Alternatively, R. Deichmann, C. D. Good, and R. Turner, in "RF Inhomogeneity Compensation in Structural Brain Imaging" in Magnetic Resonance in Medicine 47, pages 398-402, 2002, suggest a measurement process which with respect to contrast is less sensitive to variations in the HF amplitude. This process, however, has the disadvantage that the necessary radio frequency pulses turn out to be very long and radio frequency-intensive. This increases the SAR (Specific Absorption Ratio), that is more stress is placed on the patient. Moreover, specific assumptions must be made about the penetration behavior, such as for instance an isotropic dielectric focus in the head, although it cannot be presumed that these assumptions apply in this form in any concrete examination.

SUMMARY OF THE INVENTION

An object of the present invention is to provide an alternative to the described state of the art which in a relatively simple and universal way enables good compensation for contrast inhomogeneities in magnetic resonance imaging arising from the spatial distribution of the radio frequency field.

This object is achieved in accordance with the invention by a method for compensating contrast inhomogeneities in magnetic resonance (MR) images created by the spatial distribution of the radio frequency field wherein multiple individual MR images are first acquired of a particular region of the examination subject to be examined, with different radio frequency pulse sequences, which lead to different flip angles. Within one radio frequency pulse sequence, there is at least one excitation pulse, but in general there is a whole series of various radio frequency pulses one after another, for example an excitation pulse followed by additional refocusing pulses. The region can be a slice, or a three-dimensional volume.

The invention takes advantage of the fact that the desired target flip angle is achieved, or at least the achieved flip angle is close to the desired target flip angle, due to the flip angle distribution created by the spatial penetration behavior of the transmitted radio frequency field, for each of these measurements with different measurement flip angles in different locations. That is, in each of these measurements in different zones, the measurement is performed with the "right" flip angle.

The above object also is achieved in accordance with the invention by a magnetic resonance measurement system having a contrast homogenization system in order to compensate for contrast inhomogeneities created by a spatial distribution of a radio frequency field transmitted by the radio frequency antenna of the magnetic resonance measurement system. The contrast homogenization system includes a data acquisition control unit, which allows the acquisition of data for multiple individual images of a particular region with different radio frequency pulse sequences leading to different flip angles, using the radio frequency antenna. The contrast homogenization system also includes an image combination system that generates a common contrast-homogenized image based on the different individual images, so that within the contrast-homogenized image the intensity variations caused by a distribution of the flip angle are at least less pronounced than in the individual images.

As used herein, a magnetic resonance imaging system denotes any system H with the ability to generate magnetic resonance images, that is, one which has a m magnetic resonance data acquisition device and a suitable image processing system, for example in the form of an image processing computer or similar system connected to the magnetic resonance device.

The contrast homogenization system, for example, can be integrated into the usual control system used for control of the magnetic resonance device. It can, however, also be distributed among different components of the system. The implementation of the recording control system is preferably in the form of a software module that can be invoked (called) as a contrast homogenization measurement program within a computer-supported control system of the magnetic resonance device. A "computer-support control system" denotes any control system that possesses a suitable processor and additional components in order to execute the control programs provided.

The image combination of the different individual images generally can be performed during image post-processing, that is, offline, so there is also the possibility of installing the image combination system, for example, also in the form of software on an image processing computer in the system.

In order to achieve different measurement flip angles in the individual measurements, the radio frequency pulse sequences can be varied in a number of ways. In general the shape, the amplitude, and/or the duration of the pulses can be changed. Preferably, however, in each of the different measurements the same type of radio frequency pulse sequences should be used, that is, in which the radio frequency pulses have the same shape, the same temporal orientation relative to one another, and the same duration, and the voltage amplitude of the radio frequency pulse sequences or the individual radio frequency pulses can be appropriately scaled.

For combination of the individual images, there are also different possibilities:

In one particularly simple variant of the process, for each image pixel of the contrast-homogenized image, the intensities of the corresponding pixel in the different individual images are added up. Alternatively, a simple average value of the of the intensities of the corresponding pixels in the different individual images can be obtained. These methods are particularly applicable if radio frequency pulse sequences, for example spin-echo variants, are used for measurement which have the property that the signal intensity drops off quickly for actual flip angles which differ significantly from the target flip angle. This automatically leads to the maximum intensities of the individual images always being located where the actual flip angles lie close to the target flip angle. Thus a simple summation or average can ensure that in the contrast-homogenized image exactly those measurements dominate in the various locations in which the achieved flip angle is in the same range as the desired target flip angle.

Insofar as radio frequency pulse measurement sequences are used in which this condition is not fulfilled, the intensities of the corresponding pixels are preferably weighted with a weighting factor before any addition or averaging. Such weighting factors can, for example, be derived from the product of the normalized intensity at each location and a normalized flip angle difference, that is, the deviation of the flip angle achieved at the corresponding location in the measurement from the desired target flip angle of the current examination.

Thus, in one preferred embodiment of the inventive process, a spatial flip angle distribution is first derived for the region affected. This flip angle distribution can then be incorporated into the generation of the contrast-homogenized image based on the different individual images. That is, it is determined, for each location or image pixel, which actual flip angle was achieved for the currently given measurement flip angle in the appropriate measurement.

Insofar as the resolution of this derived flip angle distribution does not correspond to the resolution of the actual measurement of recorded images, it is also possible to use interpolation procedures in order to determine the probable achieved flip angle for each position in an individual image via interpolation from the derived flip angle distribution.

This flip angle distribution then, for example, can be used in the previously described process to determine the normalized flip angle difference for derivation of the weighting factor.

Alternatively, using the derived spatial flip angle distribution for each pixel, the individual image can be determined that was acquired with an excitation flip angle for the corresponding pixel that is closest to a particular target flip angle intended for the examination. In particular, during generation of the contrast-homogenized image, precisely the intensity value given at the appropriate pixel for each location or pixel in the selected individual image can be taken as the intensity value for the corresponding location in the contrast-homogenized image, as long as a sufficiently high intensity was measured for this pixel in the measurement concerned.

For this purpose, initially only the flip angle differences can be considered, and the individual image With the smallest flip angle difference selected. Afterwards, it can be checked whether the intensity is sufficient, that is, lies over a particular threshold. Then the intensity measured at the corresponding location in this individual image accordingly can be used for the contrast-homogenized image.

Alternatively—similar to the process described earlier—weighting factors or evaluation factors, for example from the product of the normalized intensities and the normalized flip angle difference, can be calculated. Then it can be determined based on a comparison between these evaluation factors which measured intensity value at a particular pixel in a particular individual image will be taken into the contrast-homogenized image.

For measurement of the spatial flip angle distribution, there are different possibilities:

In one process, first a series of so-called spin-echo images are recorded, where at first an initial excitation pulse is transmitted which excites a flip angle $\alpha$, followed by an additional excitation pulse which excites a flip angle of $2 \cdot \alpha$. Then the so-called "echo signal" is measured. A classical example of such a spin-echo recording is the transmission of a 90° pulse (that is, $\alpha=90°$) and a 180° pulse after a particular time. In order to retrieve information about the field strengths at different locations within a measurement volume, multiple series of such spin-echo images are measured with different flip angles $\alpha$. Since it is known that the dependency of the amplitude of the magnetic resonance signal on angle $\alpha$ should be proportional to $\sin^3\alpha$, it can be determined from a appropriate fit of curves corresponding to the target distribution to the measured distribution of the flip angle $\alpha$ actually achieved for each individual image pixel.

In another preferred process, a double-echo radio frequency pulse sequence with an initial excitation pulse and at least two successive refocusing pulses are sent out using the MR device. This generates an initial echo, generally called the "spin echo", and a following second echo, generally called the "stimulated echo". At least the excitation pulse is transmitted to a selected slice. This slice-selective transmission is performed using an appropriate selection of form and frequency for the excitation pulse, and a simultaneous transmission of an appropriate gradient pulse, e,g. along the base magnetic field. Then, in an excitation slice determined by the slice-selective excitation pulse, while transmitting suitable gradient pulses for phase and/or frequency coding, an initial echo image and a second echo image measured with location resolution. Such a "spatially-resolved" measurement of the echo images is possible with a process in which first both echoes are measured by sampling the time behavior with m data points several times with n different amplitudes of the phase-encoding gradient. The result of this measurement is thus a data matrix with m column and n rows for each of the echoes, that is, for the spin and stimulated echoes, in the time domain (also called k-space,) This matrix is individually subjected to a two-dimensional Fourier transform for each echo. The result for each echo is a true two-dimensional image with k·l pixels, where in general m=n=k=l is assumed. Based on the ratio of the amplitudes of the first echo image and the second echo image at different position, the flip angle at the corresponding locations in the corresponding slice can be determined.

Most preferably, the refocusing pulses are not emitted slice-selectively, that is, only the excitation pulse itself is transmitted slice-selectively. In this way, it can be avoided that the flip angle distribution measured in the process and caused by the penetration behavior of the radio frequency field may be overlaid by a flip angle distribution along the slice norm, caused by the slice selection itself.

By measuring over different neighboring slices, that is, by recording multiple two-dimensional images, the process described above can be used to generate a complete three-dimensional flip angle distribution for the current examination subject. The measurements of the flip angle distribution always use the radio frequency antenna which is also used in the actual measurement. This flip angle distribution can then be used for the following diagnostic measurements in the framework of the inventive process for contrast homogenization.

Since it is necessary in the inventive process to acquire more than one image in each region to be examined, there is naturally an increased measurement cost, that is, the measurement time is increased. The contrast of an image, however, is largely determined by the central rows of the Fourier space (k-space). Thus it is generally sufficient to record one individual image with a complete sampling of the entire Fourier space. For all the rest of the images, then, only the central k-space rows must be re-recorded, that is, measured with modified flip angles. The central k-space rows of the different measurements can then be filled in by adding the previously measured outside rows of the completely recorded image. In this way, complete images with identical resolution can be generated.

This depends on the fact that the smaller location frequencies are seen in the middle range of k-space, that is, locations which encode information about large, relatively homogeneous areas in the location space. Data entries exhibiting strong intensity shifts, are placed by the Fourier transform in the outer rows of k-space, particularly the corners. By repeated measurement of the rows of Fourier space lying in the central region, primarily those regions are thus measured repeatedly which are large and relatively homogeneous. Assuming a primarily slowly spatially varying distribution of the transmitted $B_1$ field, the acquisition of this data suffices for the generation of a contrast-homogenized image. The measurement time required is thus significantly reduced. Depending on the number of individual images used, the measurement time sometimes increases only by 10% in this manner in comparison to the recording of a non-homogenized individual image. It should be noted that even if only the rows in the central region of k-space are recorded, still the entire slice in location space is taken into account.

The inventive process thus offers the possibility of achieving a contrast-homogenization with relatively low increased cost, universally for any type of imaging (that is, for gradient echo processes, spin-echo processes, etc.), and for any subject. No additional hardware is required. Only corresponding software modules must be installed in the device control system and/or the image processing system, so that the process is also very well suited for upgrading existing magnetic resonance measurement systems.

DESCRIPTION OF THE DRAWINGS

FIG. 6 shows a pulse sequence for measurement of the flip angle distribution of a single slice in accordance with the invention.

FIG. 7 is a block diagram of a magnetic resonance measurement system constructed and operating according to the invention.

DESCRIPTION OF THE PREFERRED EMBODIMENTS

Figure 1:
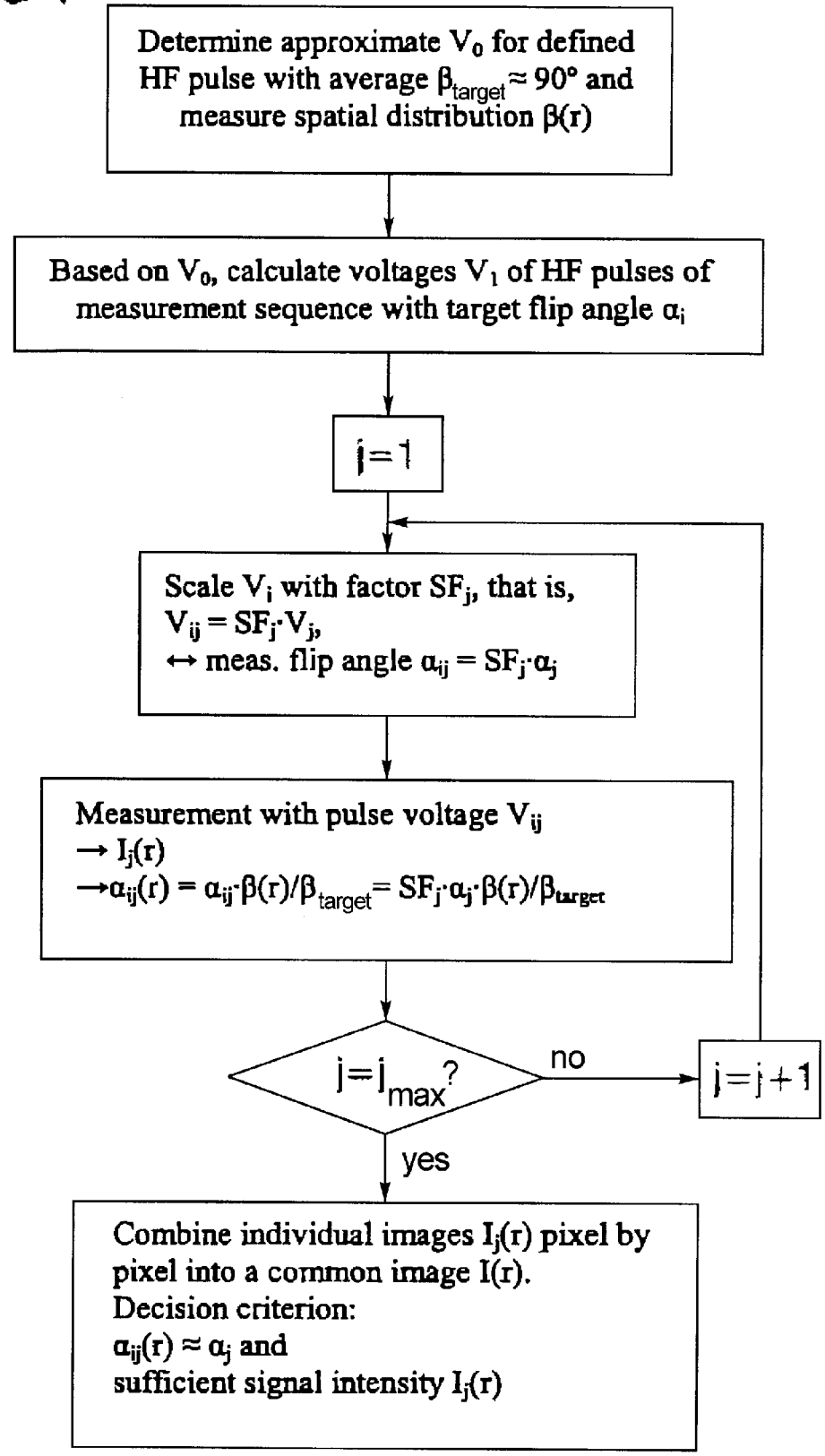
FIG. 1 is a flowchart of one embodiment of the invented contrast homogenization process.

The inventive process is basically exemplified in FIGS. 1 through 5 using flowcharts, where FIG. 1 generally describes the measurement process and FIGS. 2 through 5 respectively show different possibilities for the combination of tho individual images into a common contrast-homogenized image.

As shown in FIG. 1, before the measurement, an estimated value $V_0$ is determined in a first process step for the radio frequency pulse voltage which will generate an average spin angle $\beta_{target}$ of about 90° with a defined radio frequency pulse in the volume examined. Then a process to be described later will be used to measure the spatial distribution $\beta(r)$.

Next, in a second process step, based on the derived voltage $V_0$, a voltage $V_1$ is calculated for the radio frequency pulse of a measurement sequence for the planned examination with N target flip angles $\alpha_i$ (i=1 to N). In such a measurement sequence, depending on the task at hand, there are different radio frequency pulses with different amplitudes. Normally, however, a flip angle can be freely selected by the user in each measurement sequence, which is used to determine the contrast. The other pulses are scaled appropriately. In this process step, therefore, this adjustable flip angle is preferably first calculated as target flip angle. The other radio frequency pulses or target flip angles $\alpha_i$ of the measurement sequence are then scaled to fit this flip angle.

Next, the different measurements for the recording of the different individual images are executed in a measurement loop which includes several process steps. Each of the measurements is performed with different "target flip angles" planned for the current measurement, which will be called "measurement flip angles" below for each of the appropriate individual images. The loop variable is the variable j in the diagram in FIG. 1, which is first set to 1 in a first process step before the loops and then runs from 1 to $j_{max}$ within the loop. That is, the variable j runs for example in one execution of three measurements with three different measurement sequences from 1 to 3.

Within the loop in a first process step, the voltages $V_i$, which would result in the desired target flip angles $\alpha_i$, are scaled with a scaling factor $SF_j$, that is, the current pulse voltages $V_{ij} = SF_j \cdot V_1$ to be used in this measurement are determined. Since the flip angle depends largely linearly on the pulse voltage used, the measurement flip angles $\alpha_j$ for this measurement are correspondingly given as $\alpha_{ij} = SF_j \cdot \alpha_i$. A measurement is then executed with these pulse voltages $V_{ij}$, and thus an individual image is recorded with the desired measurement sequence with the correspondingly scaled measurement flip angles $\alpha_{ij}$.

In this image, a particular intensity $I_j(r)$ is measured at each location r or pixel r. The actual flip angle $\alpha_{ij}(r)$ for this measurement at the corresponding pixel is thus $$\alpha_{ij}(r) = \alpha_{ij} \cdot \frac{\beta(r)}{\beta_{ref}} = SF_j \cdot \alpha_i \cdot \frac{\beta(r)}{\beta_{ref}} \quad (2)$$

After the measurement, the loop variable j is increased and another measurement executed or, if the desired number $j_{max}$ of measurements has already been executed, the measurement itself ended.

The scaling factor $SF_j$ is changed for each measurement run. The scaling factor for one measurement is preferably selected as $SF_j = 1$. So for example, for a three-phase measurement, the first measurement might be performed with a scaling factor of $SF_j = 0.5$, that is, the measurement is performed with half pulse voltage, so that the measurement flip angle for this measurement comes to $\alpha_{ij} = 0.5 \cdot \alpha_i$. Then the measurement using a scaling factor 1.0 is performed, that is, a measurement is executed in which the current measurement flip angles correspond to the actually desired target flip angles. Finally, a third measurement is executed with a scaling factor $SF_j = 1.5$. The measurement flip angles are thus correspondingly $\alpha_{ij} = 1.5 \cdot \alpha_i$.

In the last process step, the individual images, which have different intensities $I_j(r)$ at different locations, are then combined pixel-by-pixel into a common contrast-homogenized image.

The decision criterion for the combination of the individual images into the contrast-homogenized image is that the actual measurement flip angle $\alpha_j(r)$ found at a location r of a particular measurement more or less corresponds to the target flip angle $\alpha_i$ desired for the examination, and that moreover a sufficient signal intensity $I_j(r)$ was given at the appropriate location r in that measurement.

Such an image combination basically also can be executed after the conclusion of a complete measurement in an image evaluation unit of the magnetic resonance system. In the sense of the invention, any external image processing computer to which the originally recorded measurements are transmitted for evaluation and execution of the invented contrast homogenization process is to be considered as a part of the magnetic resonance measurement system. This applies regardless of whether it is an image processing computer which is directly assigned to the magnetic resonance measurement device or directly connected to it, or whether the image processing computer is connected over a network to this device, or whether the data are transported on a data storage medium without direct (network) connection between the magnetic resonance device and the image processing computer.

Figure 2:
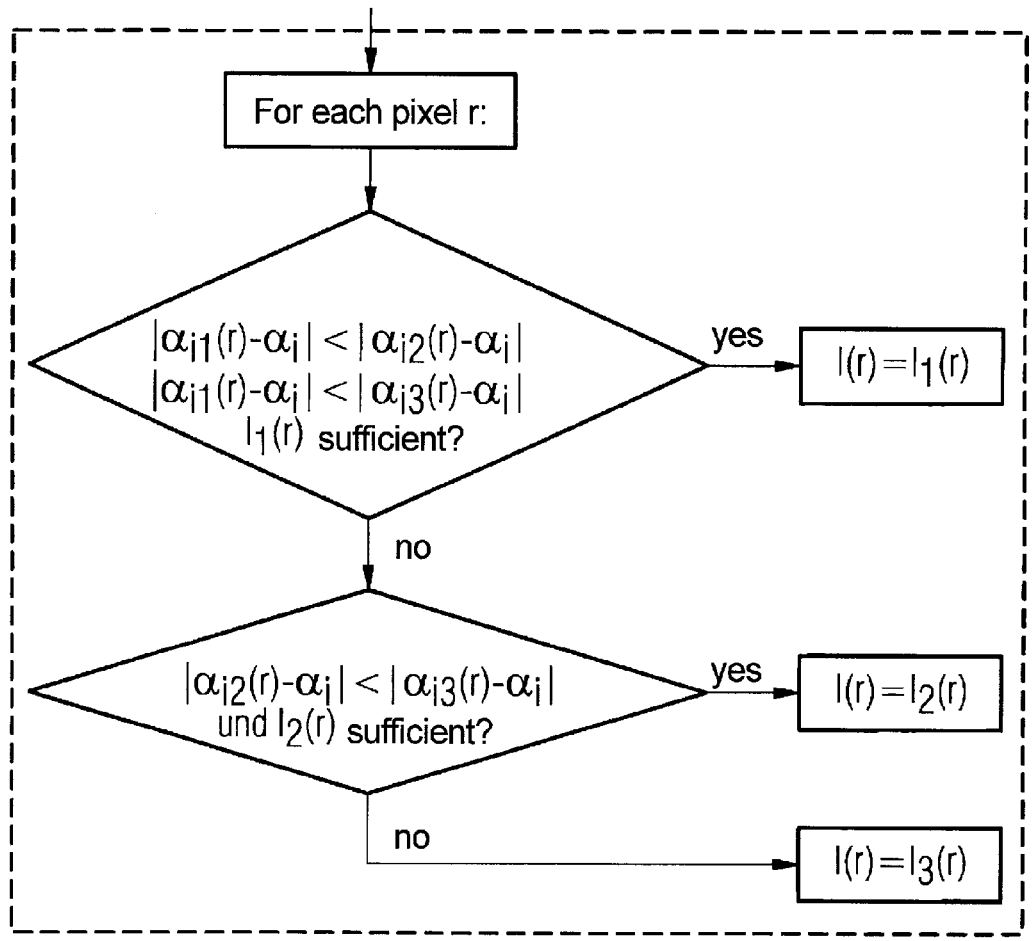
FIG. 2 shows a first variant of the last process step in FIG. 1.

On possibility for the pixel-by-pixel combination of the individual images into a contrast-homogenized image is shown in FIG. 2. In FIG. 2, for the sake of simplicity, only three different measurements are assumed. The process can, however, be extended to an arbitrary number of additional measurements or can also be executed on only two measurements.

In the process shown in FIG. 2, it is determined for each individual image pixel r or location r whether the actually occurring flip angle $\alpha_{i1}(r)$ in the first measurement lies closer to the target flip angle $\alpha_i$ than the actual flip angle $\alpha_{i2}(r)$ occurring in this location in the second measurement, and than the actual flip angle $\alpha_{i3}(r)$ measured in the third measurement. Since the ratio $\alpha_{i2}/\alpha_i \cdot SF_j$ is independent of the current flip angle $\alpha_i$ in the measurement sequence, an arbitrary flip angle $\alpha_i$ can be chosen for the corresponding measurement sequence for this calculation. It is also checked whether the intensity value $I_1(r)$ measured in this location in the first measurement is sufficiently high. If this is the case, the corresponding intensity value $I_1(r)$ is taken as the intensity value $I(r)$ in the contrast-homogenized image.

Otherwise it is checked in the next step whether the actual flip angle $\alpha_{i2}(r)$ found at the corresponding image pixel r in the second measurement is closer to the actually desired target flip angle $\alpha_i$ than the flip angle $\alpha_{i3}(r)$ measured in this location in the third measurement, and whether the intensity value $I_2(r)$ measured at this location in the second measurement is sufficiently high. If this is the case, then this intensity value $I_2(r)$ measured in the second measurement is taken as the intensity value $I(r)$ for the corresponding image pixel in the contrast-homogenized image. Otherwise, the intensity value $I_3(r)$ measured at the appropriate location in the third measurement is taken as the intensity value $I(r)$ in the contrast-homogenized image.

This means that in this process exactly the intensity value of only one of the measurements goes into each image pixel.

Figure 3:
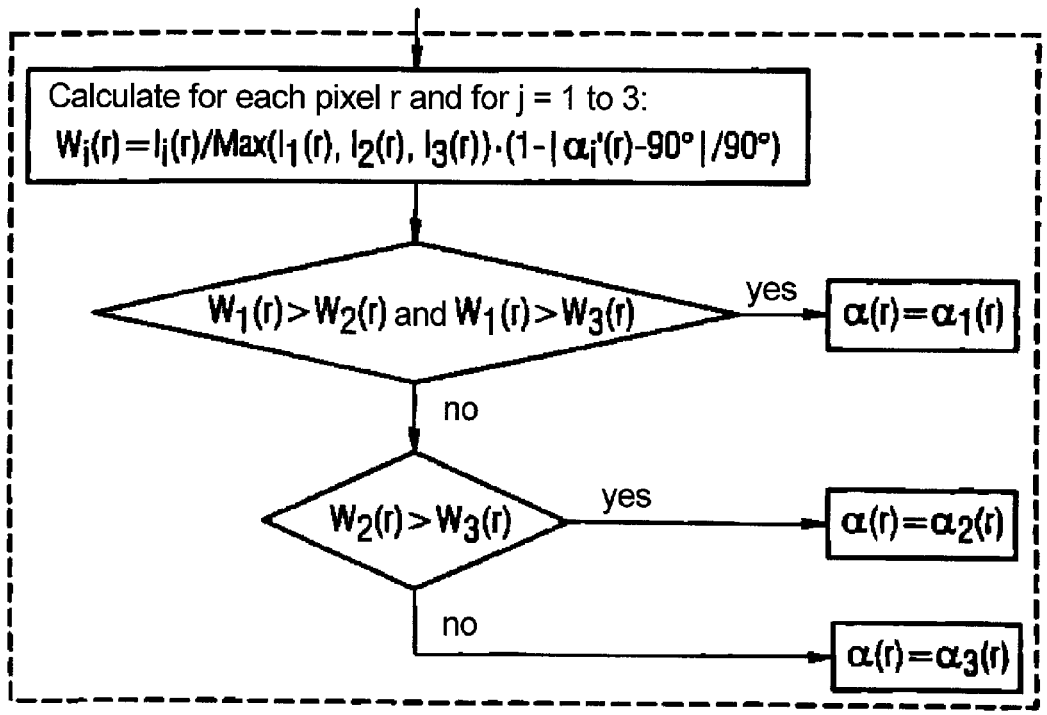
FIG. 3 shows a second variant of the last process step in FIG. 1.

An alternative process to this is shown in FIG. 3. Here, for simplicity, it is again assumed that only three measurements have been executed. This process is, however, also arbitrarily executable for only two measurements or a higher number of measurements. In this process, a value $W_j(r)$ is first calculated for each image pixel r and for all measurements j (that is, for all three measurements) as follows:

$$W_j(r) = \frac{I_j(r)}{\text{Max}(I_1(r), I_2(r), I_3(r))} \cdot \left( \frac{1 - |\alpha_{ij}(r) - \alpha_i|}{\alpha_i} \right) \quad (3)$$

Factored into these values $W_j(r)$ is the intensity value $I_j(r)$ measured in measurement j, normalized to the maximum intensity value measured in the three measurements at this image pixel r. The other factor is the deviation of the measured actual flip angle $\alpha_{ij}(r)$ from the desired target flip angle $\alpha_i$.

In the following steps, it need only be checked whether the value $W_1(r)$ from the first measurement at image pixel r is larger than the corresponding value $W_2(r)$ from the second measurement at the same location, and than the value $W_3(r)$ from the third measurement at the same location. If this is the case, then the intensity value $I_1(r)$ measured at this location in the first measurement is taken as the intensity value $I(r)$ at the corresponding location in the contrast-homogenized image. Otherwise it is checked in the second step, whether the value $W_2(r)$ from the second measurement is larger than the value $W_3(r)$ from the third measurement. If this is the case, then the intensity value $I_2(r)$ from the second measurement is taken as the intensity value $I(r)$ for the contrast-homogenized image. Otherwise, the intensity value $I_3(r)$ from the third measurement is used.

In this second process as well, only one intensity value $I_j(r)$ from r out of the j individual measurements is selected. That is, only one selection is performed. The difference from the process as in FIG. 2 consists of the fact that here, instead of selecting purely on the basis of the flip angle difference and subsequent check whether the intensity $I_j(r)$ at the corresponding location r in each measurement j lies over a threshold value, now a combined value factor is involved in which the intensities $I_j(r)$ at the corresponding location r are taken into account approximately equally to the flip angle difference.

Figure 4:
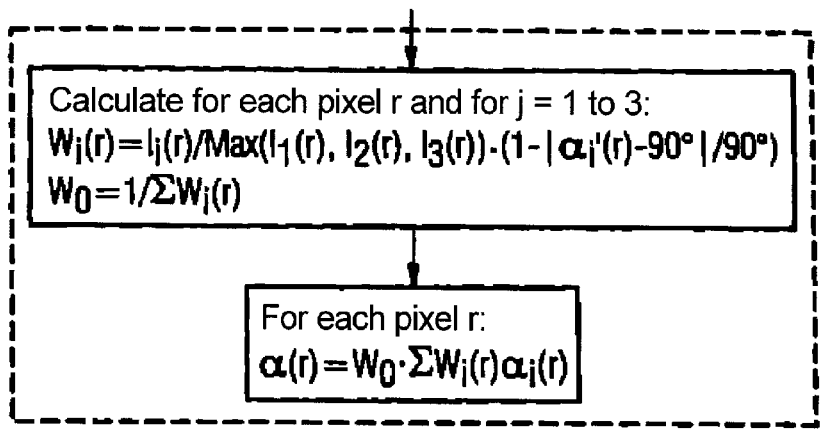
FIG. 4 shows a third variant of the last process step in FIG. 1.

In FIG. 4, an additional alternative is shown. In this process, an average intensity I(r) for each pixel r is calculated.

$$I(r) = W_0 \cdot \Sigma W_1(r) I_i(r) \quad (4)$$

The weighting factors W1(r) correspond here to the value factors derived by equation (3) in the process shown in FIG. 3. The factor $W_0$ is $$W_0 = \frac{1}{\Sigma W_1(r)} \quad (5)$$

Figure 5:
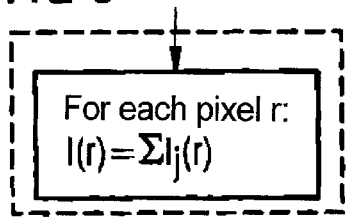
FIG. 5 shows a fourth variant of the last process step in FIG. 1.

FIG. 5 shows a particularly simple alternative, in which for each pixel r the intensity value I(r) is calculated as the sum of the intensity values $I_j(r)$ derived from the individual measurements. This variant is suitable e.g. for spin-echo measurement sequences, which have the property that the signal intensity falls off quickly for actual flip angles which deviate significantly from target flip angles (generally 90°). This automatically produces a weighting based on the flip angle difference, so that in this case a simple summation of the images already shows the desired effect of contrast homogenization. In such sequences, no measurement of the flip angle distribution as described in the uppermost process step as in FIG. 1 is necessary. Instead, the various diagnostic measurements can be performed immediately with their different measurement flip angles.

One possibility for spatially-resolved measurement of a flip angle distribution is explained below referring to FIG. 6. FIG. 6 shows a pulse sequence schema in the usual way, in which the radio frequency pulses emitted from the radio frequency antennae themselves and the gradient pulses switched with appropriate time dependency with respect to tile radio frequency pulses, all of which are emitted (activated) in order to execute a particular measurement, are each displayed on parallel, horizontal time axes.

The uppermost axis is labeled RF (Radio Frequency). The radio frequency pulses are shown on this axis. Under this, on three time axes, three gradients are shown in the three spatial directions z (parallel to the $B_0$ field direction), x, and y (each at right angles to the $B_0$ field direction). The uppermost gradient is the so-called "slice selection gradient", which lies in the z direction and selects a particular slice for excitation of spin. Under this is the so-called "phase encoding gradient" Gp, which does the phase encoding. This phase encoding gradient Gp is very quickly switched to different values during a measurement. The third gradient Gr is the so-called "read-out" or "frequency-encoding" gradient Gr, which is created in order to read out frequency-coded signals in a particular slice. A spatially-resolved acquisition of signals within the slice determined by gradient Gs can be performed by suitable switching (activation) of gradients Gp and Gr. On the lowest time axis, the schematic signal received by the ADC (Analog-Digital Converter) is shown schematically. The exact process of phase and frequency coding for location-resolved measurement within a slice, and display in a sequence schema, are known to any person of ordinary skill in the field of magnetic resonance imaging and need not be further explained herein.

As shown in the radio frequency pulse sequence in FIG. 6, an initial excitation pulse HFA for spatially-resolved measurement of the flip angle distribution $\beta(r)$ is first transmitted within a radio frequency pulse sequence HFS over the radio frequency transmission antenna of the magnetic resonance device in a slice-selective manner, which ensures that the spins in a precisely defined slice are tipped by a precession angle $\beta_{target}$, e.g. vertically to the field direction of the $B_0$ field. The slice selection is achieved by transmitting a gradient pulse GSP parallel to the transmission of the radio frequency pulse HFA, acting in the z direction, and by choosing the frequency and shape of the excitation pulse HFA in a suitable way. A sinc function pulse shape is preferable.

The second pulse within the double-echo radio frequency pulse sequence HFS is then a refocusing pulse $HFR_1$, whose amplitude and time duration are chosen in such a way that a flip angle of $2 \cdot \beta_{target}$ would be achieved. Then after a predetermined period of time, the transmission of another refocusing pulse $HPR_2$ follows, for which the amplitude and time duration is chosen in such a way that a flip angle of $\beta_{target}$ would be achieved.

As shown in the diagram, the refocusing pulses $HPR_1$ and $HPR_2$—unlike the excitation pulse HFA—are simple square wave pulses. A parallel switching of the slice selection gradient Gs is not performed, so that the refocusing pulses $HPR_1$ and $HPR_2$ are transmitted in a non-slice-selective way. Only a short negative gradient pulse is sent in the slice gradient Gs directly after the first slice gradient pulse GSP, which is necessary for the slice selection for the excitation pulse HFA, in order to reset the dephasing of the magnetization which is undesirably but unavoidably generated by the slice gradient pulse GSP.

Between the excitation pulse HFA and the first refocusing pulse $HFR_1$, the phase coding gradient Gp is sent, where the gradient pulse is repeated with different amplitudes for successive repetitions of the pulse sequence. This is represented by the multiple overlaid pulses into a single pulse GPP.

After the first refocusing pulse $HFR_1$, there follows an initial frequency coding gradient pulse $GPF_1$, to generate an initial echo signal, the spin-echo signal SE. A second frequency-coded gradient pulse $GPF_2$ follows then after the second refocusing pulse $HFR_2$, to generate the second echo signal, the stimulated echo signal STE.

The gradient pulse emitted before the two frequency-coded gradient pulses $GPF_1$, $GPF_2$, which is emitted partially simultaneously with the phase-coded gradient pulse, here serves only to dephase the spins in the direction of the read-out gradient Gr, thus achieving a refocusing of the echo during the read-out time while the frequency-coding gradient pulses $GPF_1$, $GPF_2$ are applied. This pulse is generally only half as long as the actual frequency-coded gradient pulses $GPF_1$ and $GPF_2$.

For the signal amplitudes $A_{SE}$, $A_{STE}$ of the spin echo signal SE and the stimulated echo signal STE, the following apply:

$$A_{SE} = e^{i\phi}\sin(\beta)\sin^2(\beta)$$

$$A_{STE} = e^{i\phi}\sin(\beta)\sin^2(\beta)\cos(\beta) \quad (6a)$$

Here, β' represents the precession angle achieved by the excitation pulse HFA and β the precession angle achieved by the non-slice-selective refocusing pulses $HFR_1$ $HFR_2$, that is, a radio frequency pulse of the form $\beta'_{target}$–$2\beta_{target}$–echo 1–$\beta_{target}$–echo 2 would be transmitted, where the values of $\beta'_{target}$ and $\beta_{target}$ are each actually 90°.

$$A_{SE} = \int dz e^{i\phi}\sin(\beta'(z))\sin^2(\beta) = e^{i\phi}\sin^2(\beta)c$$

$$A_{STE} = \int dz e^{i\phi}\sin(\beta(z))\sin^2(\beta) = e^{i\phi}\sin^2(\beta)\cos(\beta)c \quad (6a)$$

Assuming that only the precession angle β' varies along the slice normal, that is, z direction, due to the slice-selective transmitted excitation pulse, we arrive at with the constant factor $$c = \int dz \sin(\beta'(z)) \quad (7b)$$

For the relationship of the two amplitudes, therefore, $$\cos\beta = A_{STE}/A_{SE} \quad (8)$$

According to this equation, the flip angle β achieved for a given target precession angle $\beta_{target}$ can be determined with the chosen pulse sequence via the ratio of the amplitude $A_{STE}$ of the stimulated echo STE to the amplitude $A_{SE}$ of the spin echo SE slice-selectively, that is, spatially-resolved in a slice determined by the excitation pulse, without the result being falsified by a flip angle distribution along the slice normal generated by the excitation pulse.

In order to accelerate the measurement of a larger volume composed of multiple thin slices, a multi-slice measurement is preferably executed, in which initially multiple successive excitation pulses are transmitted slice-selectively within the double-echo radio frequency pulse sequence. This excites spins in different slices. Following the excitation pulses, the non-slice-selective refocusing pulses are transmitted for all slices together to generate the first echoes and second echoes in the different slices. In this way, despite the use of non-selective radio frequency pulses within the repetition time, it can be achieved that signals from multiple slices can be measured in parallel, independently of one another. Otherwise one would have to wait through the entire repetition time after the recording of the signals from one slice, resulting in a significantly increased overall measurement time.

In order to reduce the influence of the $T_1$ relaxation time on the measurement results of the flip angle distribution β(r), an average $T_1$ value can be assumed and the amplitude $A_{STE}$ of the stimulated echo signal STE corrected with a corresponding correction factor taking the average $T_1$ value into account, before the flip angle β(r) is determined. Corresponding correction values are known in the literature, where it is assumed that the relaxation duration $T_1$ is between 300 and 500 ms. Since the $T_1$ relaxation is tissue-dependent, the correction factor can also be chosen depending on a material type found in the corresponding location in the examination subject.

In a more exact but slower process, a flip angle distribution is measured multiple times with location resolution for the same slice to reduce the relaxation influence, where different target flip angles are predetermined by the pulse sequence. The measured flip angle distributions for the determination of a corrected field distribution in the affected slice are then combined pixel by pixel in a manner quite analogous to the invented method for combination of a contrast-homogenized image from different individual images. To this end, reference is made to the processes described above in reference to FIGS. 1 through 5.

FIG. 7 shows a basic block diagram for an embodiment of a magnetic resonance imaging system 1 with which the invented process can be executed.

The core of this magnetic resonance measurement system 1 is a scanner (data acquisition unit) 2 in which a test subject O is positioned on a bench in an annular basic field magnet 13. Within the basic field magnet 13 there is a radio frequency antenna 12 for transmission of the MR radio frequency pulses and a gradient system 17 for emitting gradient pulses. This involves an off-the-shelf scanner 2 which need not fulfill any particular additional requirements for the invented process. The scanner 2 is controlled by a control system 3, which is shown here as a separate unit. Connected to control system 3 over a data bus 16 are a terminal (console) 4, a mass storage device 5, and an image processing computer 14. The terminal 4 serves as a user interface over which a user can operate the control system 3 and thus the scanner 2. The mass storage device 5 serves, for example, to store images recorded using the magnetic resonance measurement system.

The bus 16 is connected via an interface 6 with the control system 3. The control system 3 is itself connected via interfaces 11, 10 with the scanner 2. The control system 3 and the terminal 4, the image processing computer 14, and the storage 5 can also be integrated components of the scanner 2.

The entire magnetic resonance measurement system 1 furthermore has all additional standard components and features, such as for example interfaces for connection to a communications network, for instance an image information system (Picture Archiving and Communication System, PACS). These components are however not shown in FIG. 14 in the interest of clarity.

Over terminal 4, bus 16, and interface 6, the operator can communication with a control unit 7 which controls the scanner 2 over interface 11 and, for example, performs the transmission of the desired radio frequency pulse sequences through antenna 12, and selects the gradients in a way suitable to perform the desired measurements.

Via the interface 10, the measurement data from the scanner 2 are acquired and collected in a signal evaluation unit 9, which can then be displayed, for example, over interface 6 on the terminal 4 and/or stored in the storage device 5.

The magnetic resonance measurement system 1 has a special recording control system 8 in accordance with the invention as part of the (general) control system 3. This recording control system 8, following an appropriate command from terminal 4 and/or fully automatically within an examination program execution, ensures that the required measurement sequences are caused to be transmitted from the antenna 12 by the control unit 7 for multiple measurement of the same region with different voltage amplitudes according to the previously described inventive process, and causes the gradients to be controlled accordingly. The magnetic resonance signals thereby acquired are then passed to the signal evaluation unit 9 in the usual way, which evaluates the dada and then sends it on to the image processing computer 14, the terminal 4, and/or the mass storage device 5.

The image processing computer 14 preferably has an image reconstruction module 15 in the form of suitable software, which then, corresponding to the previously described process, executes the combination of the individual images recorded in the individual measurements in a post-processing run. In order to minimize the computational effort, the different measurements should preferably be recorded as complete three-dimensional data sets for the interesting regions. Only when a particular slice is selected by an operator sitting for example at the terminal should the image combination for generation of a contrast-homogenized image be performed for the corresponding slice.

It is also possible—for instance in times in which the image processing computer or other computers connected on bus 16 to or networked with the system shown are not busy—to use the process to combine complete 3D data sets consisting of different 3D data sets measured with different flip angles, in order then to generate a common contrast-homogenized three-dimensional data set, which could then for example be stored as a single measurement in mass storage device 5. The original individual measurements could in principle be deleted, so that storage space is saved in the long term, since only the contrast-homogenized data must be stored.

In general, the recording control unit 8, the signal evaluation unit 9, and the control unit 7 are implemented as software modules on a processor of control system 3. Purely software-based implementation has the advantage that already existing magnetic resonance system can be upgraded via a corresponding software upgrade. It is also possible for the recording control system 8 displayed as a single block in FIG. 14, or a corresponding "recording control module" might consist of multiple components or subroutines. These subroutines may also already be used by other components of control system 3, that is, already existing subroutines of other program units may optionally be accessed in order to keep the cost of implementing the recording control module as low as possible.

It is also possible to implement the image combination unit as a software module within control system 3 of the scanner 2—for example, directly connected to the recording control system—insofar as the control system 3 possesses sufficient computing capacity. The image combination system could in particular be integrated into the signal evaluation unit 9. Contrast-homogenized data could then be emitted directly from the scanner 2.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for compensating contrast inhomogeneities in magnetic resonance images, comprising the steps of:

acquiring a plurality of different sets of magnetic resonance data from a region of an examination subject by irradiating said region with a plurality of different radio frequency pulse sequences, each of said different radio frequency pulse sequences producing a radio frequency field having a spatial distribution in said region and thereby producing a distribution of flip angles of nuclear spins in said region;

generating a plurality of magnetic resonance images respectively from said plurality of sets of magnetic resonance data, each of said magnetic resonance images having an intensity variation caused by said distribution of flip angles; and generating a common contrast-homogenized image of said region from said plurality of magnetic resonance images having, at least in an area of said common contrast-homogenized image, an intensity variation due to said distribution of flip angles that is less than the intensity variation due to the distribution of flip angles in any of said plurality of magnetic resonance images.

2. A method as claimed in claim 1 comprising employing radio frequency pulse sequences in said plurality of pulse sequences having respectively different pulse voltage amplitudes, but being otherwise identical.

3. A method as claimed in claim 1 wherein each of said plurality of magnetic resonance images is comprised of pixels, and wherein the step of generating said common contrast-homogenized image comprises adding respective corresponding pixels in said plurality of magnetic resonance images for generating respective corresponding pixels in said common contrast-homogenized.

4. A method as claimed in claim 3 comprising adding said respective corresponding pixels of said plurality of magnetic resonance images with respective weights dependent on the intensity variation exhibited by the respective magnetic resonance images containing the respective pixels.

5. A method as claimed in claim 1 wherein each of said plurality of magnetic resonance images is comprised of pixels, and wherein the step of generating said common contrast-homogenized image comprises averaging respective corresponding pixels in said plurality of magnetic resonance images for generating respective corresponding pixels in said common contrast-homogenized.

6. A method as claimed in claim 5 comprising averaging said respective corresponding pixels of said plurality of magnetic resonance images with respective weights dependent on the intensity variation exhibited by the respective magnetic resonance images containing the respective pixels.

7. A method as claimed in claim 1 comprising determining a spatial distribution of said flip angles in said region, and generating said contrast-homogenized image from said plurality of magnetic resonance images dependent on said spatial flip angle distribution.

8. A method as claimed in claim 5 wherein each of said magnetic resonance images is comprised of a plurality of pixels, and, using said spatial flip angle distribution, generating each individual magnetic resonance images from pixels produced with a flip angle in said spatial flip angle distribution that is closest to a predetermined target flip angle.

9. A method as claimed in claim 8 comprising additionally determining, for a pixel produced with a flip angle closest to said target flip angle, whether an intensity value of said pixel is sufficiently high and, if so, using said intensity value as the intensity value for the corresponding pixel in said contrast-homogenized image.

10. A method as claimed in claim 7 wherein the step of determining said spatial flip angle distribution comprises the steps of:

emitting a double echo radio-frequency pulse sequence including a first excitation pulse followed by at least two refocusing pulses, respectively for generating a first echo and a following second echo, at least the excitation pulse being slice selective for exciting said nuclear spins, by giving said nuclear spins said flip angle, in a selected slice of the examination object;

in the slice defined by said slice selective excitation pulse, spatially encoding a first echo image, associated with said first echo, and a second echo image, associated with said second echo by activatinf respective gradient pulses for at least one of phase encoding and frequency encoding, said first and second echo images respectively having amplitudes at a plurality of locations in the first and second echo image; and from a ratio of said amplitudes of said first and second echo images at said plurality of locations, determining said spatial flip angle distribution in the slice selected by said excitation pulse.

11. A method as claimed in claim 10 comprising emitting said refocusing pulses as non-slice selective pulses.

12. A method as claimed in claim 1 comprising entering said respective sets of magnetic resonance data into respective k-spaces as entries forming a plurality of rows of each k-space, said plurality of rows including central rows, and using only the entries of the central rows of the respective k-spaces for respectively producing said plurality of magnetic resonance images.

13. A magnetic resonance tomography apparatus comprising:

a magnetic resonance data acquisition unit comprising a radio frequency antenna, and configured to interact with an examination subject;

an image reconstruction computer;

a control unit connected to said data acquisition unit and to said image reconstruction computer that operates said data acquisition unit to acquire a plurality of different sets of magnetic resonance data from a region of an examination subject by irradiating said region with a plurality of different radio frequency pulse sequences from said radio frequency antenna, each of said different radio frequency pulse sequences producing a radio frequency field having a spatial distribution in said region and thereby producing a distribution of flip angles of nuclear spins in said region; and said image reconstruction computer generating a plurality of magnetic resonance images respectively from said plurality of sets of magnetic resonance data, each of said magnetic resonance images having an intensity variation caused by said distribution of flip angles, and said image reconstruction computer generating a common contrast-homogenized image of said region from said plurality of magnetic resonance images having, at least in an area of said common contrast-homogenized image, an intensity variation due to said distribution of flip angles that is less than the intensity variation due to the distribution of flip angles in any of said plurality of magnetic resonance images.

14. A computer readable medium encoded with a data structure, said medium being loadable into a control unit of a magnetic resonance tomography apparatus and said data structure causing said control unit to control said magnetic resonance tomography apparatus to:

acquire a plurality of different sets of magnetic resonance data from a region of an examination subject by irradiating said region with a plurality of different radio frequency pulse sequences, each of said different radio frequency pulse sequences producing a radio frequency field having a spatial distribution in said region and thereby producing a distribution of flip angles of nuclear spins in said region;

generate a plurality of magnetic resonance images respectively from said plurality of sets of magnetic resonance data, each of said magnetic resonance images having an intensity variation caused by said distribution of flip angles; and generate a common contrast-homogenized image of said region from said plurality of magnetic resonance images having, at least in an area of said common contrast-homogenized image, an intensity variation due to said distribution of the flip angle that is less than the intensity variation due to the distribution of flip angles in any of said plurality of magnetic resonance images.

* * * * *